(12) United States Patent
Greim et al.

(10) Patent No.: US 7,550,973 B2
(45) Date of Patent: Jun. 23, 2009

(54) MAGNETIC RESONANCE APPARATUS, METHOD AND AUXILLIARY COIL ELEMENT FOR MANIPULATION OF THE $B_1$ FIELD

(75) Inventors: Helmut Greim, Adelsdorf (DE); Steffen Wolf, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/052,835

(22) Filed: Mar. 21, 2008

(65) Prior Publication Data

US 2008/0231280 A1 Sep. 25, 2008

(30) Foreign Application Priority Data

Mar. 23, 2007 (DE) .................. 10 2007 013 996

(51) Int. Cl.
*G01V 3/00* (2006.01)
(52) U.S. Cl. ...................... 324/309; 324/318
(58) Field of Classification Search ......... 324/300–322; 600/407–445
See application file for complete search history.

(56) References Cited

U.S. PATENT DOCUMENTS

| 6,943,552 | B2 | 9/2005 | Renz | |
| 6,980,001 | B2 * | 12/2005 | Paley et al. | .................. 324/318 |
| 7,204,798 | B2 * | 4/2007 | Zdeblick et al. | ................ 600/17 |
| 7,242,193 | B2 | 7/2007 | Feiweier | |
| 2007/0255128 | A1 | 11/2007 | Nistler | |

\* cited by examiner

*Primary Examiner*—Brij B Shrivastav
(74) *Attorney, Agent, or Firm*—Schiff Hardin LLP

(57) ABSTRACT

In a method and arrangement for local manipulation of a $B_1$ field in a first region of an examination subject in an examination volume of a magnetic resonance system, a $B_1$ measurement value that represents the $B_1$ field in the sub-volume during an adjustment measurement is integrally determined, and in desired radio-frequency signal parameters for a subsequent magnetic resonance measurement are predetermined on the basis of the determined $B_1$ measurement value. At least during the adjustment measurement, the $B_1$ field is influenced within a second region counter to the manipulation intended in the first region by means of an auxiliary coil element which is arranged in or at the second region of the sub-volume remote from the first region.

18 Claims, 5 Drawing Sheets

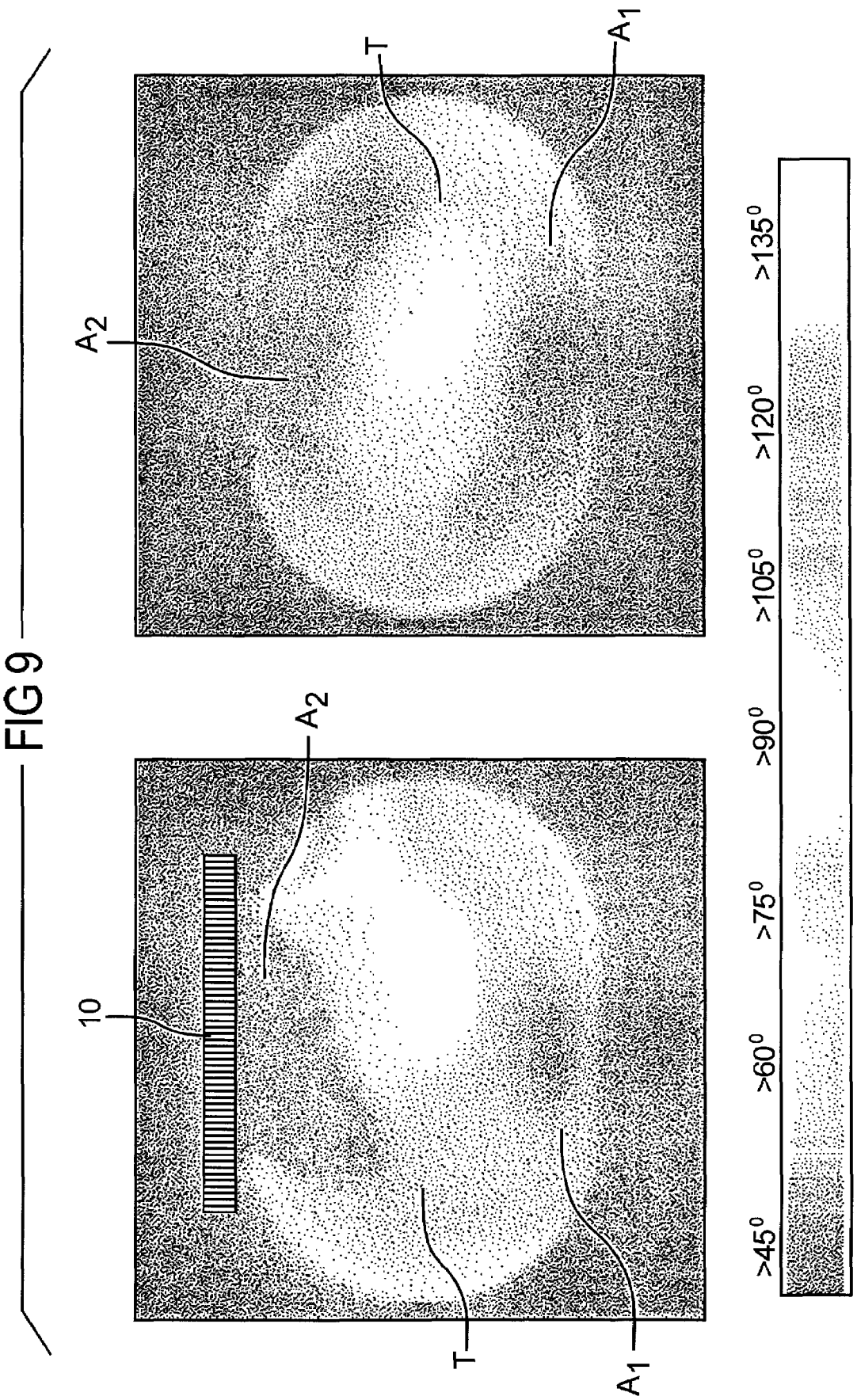

MAGNETIC RESONANCE APPARATUS, METHOD AND AUXILLIARY COIL ELEMENT FOR MANIPULATION OF THE $B_1$ FIELD

BACKGROUND OF THE INVENTION

1. Field of the Invention

The invention concerns a method for local manipulation of a $B_1$ field in a first region of an examination subject arranged in an examination volume of a magnetic resonance system, and in which, in a calibration measurement, a $B_1$ measurement value, that represents the average $B_1$ field generated by an antenna arrangement of the magnetic resonance system, is integrally determined over at least one specific sub-volume of the examination volume (for example over a defined slice), and in which desired radio-frequency signal parameters (in particular an amplitude of the emitted radio-frequency signals) are predetermined for a subsequent magnetic resonance measurement on the basis of the determined $B_1$ measurement value. The invention also concerns a magnetic resonance system as well as an auxiliary coil element for implementation of such a method.

2. Description of the Prior Art

Magnetic resonance tomography is a wide-spread technique for acquisition of images of the inside of the body of a living examination subject. In order to acquire an image with this method, the body or the body part of the patient or test subject to be examined must initially be exposed to an optimally homogeneous, static basic magnetic field that is generated by a basic field magnet of the magnetic resonance system. Rapidly switched gradient fields that are generated by gradient coils are superimposed on this basic magnetic field for spatial coding during the acquisition of the magnetic resonance images. Moreover, radio-frequency pulses of a defined field strength (known as the "$B_1$ field") are radiated with radio-frequency antennas into the examination subject. The nuclear spins of the atoms in the examination subject are excited by means of these radio-frequency pulses such that they are deflected from their equilibrium state (parallel to the basic magnetic field) by an amount known as an "excitation flip angle" (also called a "flip angle" for short). The nuclear spins then precess around the direction of the basic magnetic field. The magnetic resonance signals thereby generated are acquired by radio-frequency acquisition antennas. The magnetic resonance images of the examination subject are generated on the basis of the acquired magnetic resonance signals.

For emission of the required radio-frequency pulses in the patient positioning region, the tomography scanner typically has an antenna structure permanently installed in the housing of the scanner. This radio-frequency antenna is also designated as a "body coil" or "whole-body coil". It has (for example in the frequently employed "birdcage structure") a number of conductor rods arranged around the patient space and running parallel to the main field direction that are connected with one another by ferrules (annular conductors) at the facing sides of the coil. As an alternative, there are also other antenna structures permanently installed in the housing such as, for example, saddle coils. Moreover, local coils can also be used that are arranged directly on the body of the patient, but in most cases the local coils are normally used only as acquisition coils. The emission of the radio-frequency pulses for excitation of the spins ensues with the whole-body coil.

An adjustment or calibration measurement, known as a "transmitter adjust measurement", is typically implemented before the actual magnetic resonance acquisition. In this adjustment measurement the voltage value at the transmission coil that enables a 90° or 180° deflection of the spins is sought in a compensation process. The integral value over a specific excited volume (for example a thicker slice within the examination volume) is typically taken into account in this measurement. The achieved flip angle α is thereby often measured as a $B_1$ measurement value, which is the average flip angle in this volume since the measurement is integrated over the entire volume. This average flip angle can be directly translated into the average $B_1$ field radiated in the sub-volume.

Considerable eddy currents are frequently induced in patients upon radiation of the radio-frequency pulses, in particular given newer magnetic resonance systems with basic magnetic fields that are equal to or greater than three Tesla. As a result, the actual homogeneous radiated $B_1$ field is more or less strongly distorted in the examination volume. In individual cases this can lead to the situation that a reliable magnetic resonance measurement is problematic in specific body regions of the patient and delivers unusable results. A typical problem case is the region of the spinal column of the patient. The $B_1$ field radiated in this region is frequently lower than in the remaining regions of the body. An acquisition of the spinal column image data without field correction would therefore lead to a poor exposure and to a lower signal/noise ratio, i.e. to a poorer contrast.

Local field corrections by the use of, for example, dielectric cushions are conventionally implemented in order to be able influence the structure of the radiated magnetic field in a suitable manner in optimal detail in all regions of the examination volume, in order to thus achieve an optimally good homogeneity of the $B_1$ field in the examination volume. However, the spinal column imaging typically ensues with the use of a local coil arrangement (also called a "spine coil array") that is placed under the patient lying on his or her back on the examination table. In order to acquire an optimally high signal via this local coil and thus to achieve a good signal/noise ratio, the distance between the local coil and the patient should be optimally small. It is therefore disadvantageous to place dielectric cushions in the region of the spinal column (i.e. between the local coil and the back of the patient) since the distance between coil and patient is thereby increased.

SUMMARY OF THE INVENTION

An object of the present invention is to provide an improved method for local manipulation of a $B_1$ field.

This object is achieved according to the invention by the use of an auxiliary coil element that is not arranged at the actual local first region wherein the $B_1$ field is to be manipulated, but rather is located at a second region of the sub-volume remote from this first region. With the use of the auxiliary coil element, the $B_1$ field is influenced within the second region counter to the manipulation intended in the first region, at least during the adjustment measurement. This means that the field is decreased in the second region, for example, in order to increase the field in the first region, or vice versa.

The invention thereby utilizes the fact that within the adjustment measurement, the $B_1$ measurement value on which the desired radio-frequency signal parameters (such as, for example, the amplitude of the emitted radio-frequency pulses or other parameters that influence the field distribution) are based is determined by integration over the entire sub-volume. Due to the manipulation of this second sub-region in the opposite direction, the $B_1$ measurement value is modified overall in this direction so that desired radio-frequency signal parameters are correspondingly provided that counteract this effect. The desired effect in the first sub-region to be manipulated is thus also provided given the emission of the radio-frequency signals in the subsequent magnetic resonance measurement. For example, if it is necessary to increase the field near the spinal column in the back region of the patient, the $B_1$ field is reduced there during the adjustment measurement with an auxiliary coil element located on the abdomen. Overall, a lower $B_1$ measurement value is therefore measured and the desired radio-frequency signal parameters are thus established such that a higher $B_1$ field is radiated during the magnetic resonance measurement, whereby the $B_1$ field is also increased in the back region.

A specific region can thus be influenced with the inventive method without a dielectric cushion or another field correction element having to be placed at this region itself, whereby the aforementioned disadvantages are avoided.

In an embodiment of the method, an auxiliary coil element that destructively resonates in a targeted manner to reduce the $B_1$ field within the second region during the adjustment measurement is arranged in or at the second region to increase the $B_1$ field in the first region. This can be achieved in that the auxiliary coil element exhibits an eigenresonance frequency which lies somewhat below the magnetic resonance frequency. Given a coil with an eigenresonance frequency that is lower than the actual magnetic resonance frequency, the remaining blind resistance acts inductively and thus the coil is attenuating at its center and in a specific region axial to the coil. The auxiliary coil element is advantageously detuned downward by up to approximately 10 to 15%. For example, given a magnetic resonance frequency of 123 MHz an auxiliary coil element with a resonance frequency of 108 MHz proves advantageous.

In an other embodiment, an auxiliary coil element that constructively resonates in a targeted manner to increase the $B_1$ field within the second region during the adjustment measurement is arranged in or at the second region to reduce the $B_1$ field in the first region. For this purpose, the auxiliary coil element advantageously exhibits an eigenresonance frequency which lies somewhat above the magnetic resonance frequency, for example up to approximately 10 to 15% higher. Namely, if the eigenresonance frequency of the coil is higher than the magnetic resonance frequency, the remaining blind resistance is thus capacitive and the coil acts in an amplifying manner at its center or in an axial region located close to the coil.

Only when the coil is strongly detuned (for example significantly more than 20% in addition to the magnetic resonance frequency) does it have no effect at all anymore and is thus invisible for the MR measurement.

In a preferred embodiment, the auxiliary coil element is activated only in transmission phases of the magnetic resonance system in which radio-frequency pulses are emitted by the magnetic resonance system. By contrast, the auxiliary coil element is deactivated in acquisition phases in which the induced magnetic resonance signals are acquired by the magnetic resonance system. This means that additional power is not still absorbed by the auxiliary coil element within the acquisition phases, in which the signal is relatively low anyway.

A preferred inventive magnetic resonance system has an antenna arrangement for generation of a $B_1$ field in an examination subject in an examination volume of the magnetic resonance system, an auxiliary coil element for local manipulation of a $B_1$ field in a region of the examination subject arranged in the examination volume, and a control device designed such that a $B_1$ measurement value is integrally determined over at least one specific sub-volume of the examination volume in the framework of an adjustment measurement, the $B_1$ measurement value representing the average $B_1$ field generated by the antenna arrangement of the magnetic resonance system in the appertaining sub-volume during the adjustment measurement. The desired radio-frequency signal parameters for a subsequent magnetic resonance measurement are predetermined based on the determined $B_1$ measurement value. The auxiliary coil element and/or the control device are thereby fashioned such that the auxiliary coil element is activated only in transmission phases of the magnetic resonance system and deactivated in acquisition phases.

In a preferred embodiment, an inventive auxiliary coil element is employed that has a circuit arrangement that automatically activates the auxiliary coil element in the transmission phases. In other words, the activation of the auxiliary coil element in the transmission phases and the deactivation of the auxiliary coil element in the acquisition phases ensues wholly automatically via the auxiliary coil element by design. A correspondingly designed inventive auxiliary coil element for local manipulation of a $B_1$ field in a region of an examination subject arranged in an examination volume of a magnetic resonance system which exhibits a corresponding circuit arrangement that is fashioned such that the auxiliary coil element is automatically activated only in transmission phases of the magnetic resonance system and is deactivated in acquisition phases can simply be placed at or on the patient at the desired position by the operating personnel of the magnetic resonance system, for example. Further circuiting measures with the magnetic resonance system or, respectively, a cabling with the magnetic resonance system and subsequent activation are not necessary.

In a simple exemplary embodiment of such an auxiliary coil element, the circuit arrangement comprises a number of switch elements integrated into an oscillating circuit of the auxiliary coil element which interrupt the oscillating circuit in the non-conductive state and which automatically conduct above a limit value induced via an applied radio-frequency field. For example, it is advantageous to employ a circuit arrangement with two radio-frequency rectifier diodes (advantageously Schottky diodes) connected in antiparallel in an oscillating circuit of the auxiliary coil element.

In an alternative exemplary embodiment, the activation of the auxiliary coil element in the transmission phases and the deactivation of the auxiliary coil element in the acquisition phases ensues via an active connection of the auxiliary coil element. For this purpose, the auxiliary coil element preferably comprises a circuit arrangement with a gate input via which the auxiliary coil element can be activated or deactivated by the control device. This circuit arrangement can, for example, comprise a diode which interrupts an oscillating circuit of the auxiliary coil element and which is switched through for activation via the gate input. Alternatively, due to a corresponding connection via the control device, the eigenresonance frequency of the auxiliary coil element can be shifted so far relative to the magnetic resonance frequency that the auxiliary coil element no longer has an effect and is invisible.

The use of such an actively connected auxiliary coil element has the advantage that the auxiliary coil element can also be wired such that it is activated only during the adjustment measurement and is permanently deactivated during the actual magnetic resonance measurement insofar as this is desired in the individual case.

In principle, the auxiliary coil element can also be removed again after the adjustment measurement and before the actual magnetic resonance measurement when, an effect of the auxiliary coil element is not desired during the actual magnetic resonance measurement. However, this requires an additional work step and thus corresponding time expenditure in the examination.

BRIEF DESCRIPTION OF THE DRAWINGS

FIG. 9 shows two magnetic resonance comparison measurements on a phantom to show the effect of the inventive method.

DESCRIPTION OF THE PREFERRED EMBODIMENTS

Figure 1:
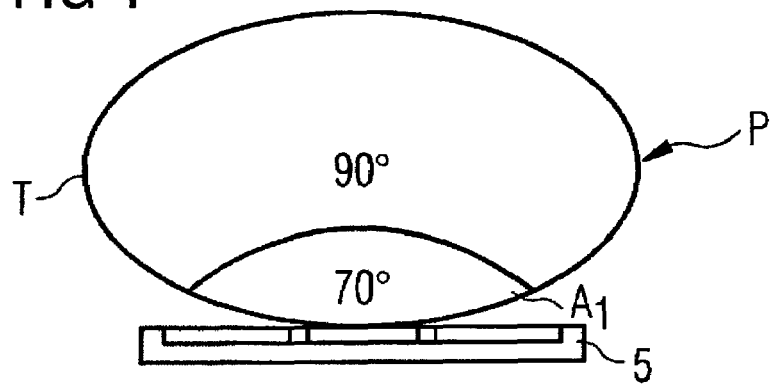
FIG. 1 is a schematic representation in cross-section of the flip angle distribution in the body of a patient arranged on a spinal column local coil.

In the following the method is explained in a typical exemplary embodiment in which a magnetic resonance exposure of the spinal column region of a patient P should be generated. FIG. 1 shows such a typical exemplary embodiment. The patient P here lies with his or her back on a spinal column local coil 5. In the adjustment measurement a $B_1$ field is set within a sub-volume T (here a relatively thick slice situated (i.e. lying in the image plane) perpendicular to the longitudinal axis of the patient) of the patient P such that an average flip angle of 90° is advantageously achieved in this sub-volume T.

The adjustment measurement ensues by emitting a specific radio-frequency field, then the flip angle distribution in the sub-volume T is measured and it is thus checked whether the radio-frequency field strength is sufficient or too low or too high. An adjustment of the transmission parameters then ensues so that the average flip angle of 90° is achieved with optimal precision in the sub-volume T.

However, due to the field inhomogeneities a flip angle of only 70° is achieved in a first region $A_1$ directly above the spinal column local coil 5 along the spinal column of the patient, contrary to which the desired flip angle of 90° is achieved only in the remaining regions of the body.

Figure 2:
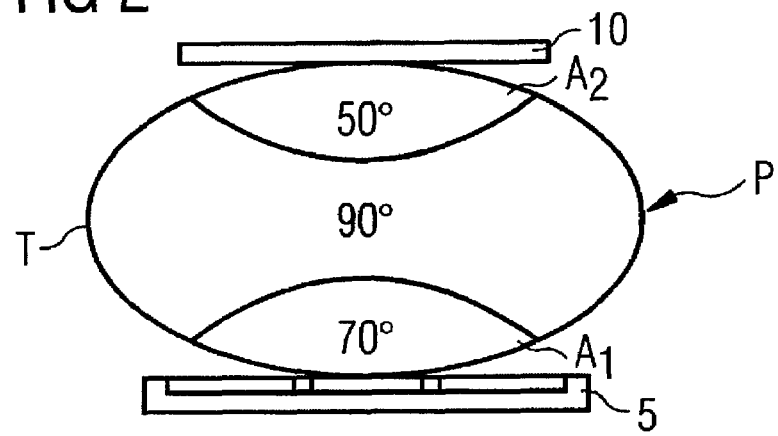
FIG. 2 shows the flip angle distribution in the patient body according to FIG. 1 with an auxiliary coil element placed on the abdomen.

In order to now increase the flip angle in the region $A_1$ of the spinal column, an auxiliary coil element 10 which destructively resonates during the emission of the radio-frequency pulses for the adjustment measurement is placed on the abdomen of the patient P. One possible design of such an auxiliary coil element 10 is explained further later using FIG. 4. This auxiliary coil element 10 ensures that the flip angle of the adjustment measurement is likewise reduced in an axial region $A_2$ of the auxiliary coil element 10, i.e. directly below the auxiliary coil element 10 in the abdomen region $A_2$ of the patient P. This is shown in FIG. 2. Here, with the use of the auxiliary coil element 10, in the adjustment measurement the flip angle in the abdomen region $A_2$ (which is removed from the first region $A_1$ in which the $B_1$ field should actually be increased) is reduced to 50°.

A lower average flip angle is thus measured overall in the integral measurement of the flip angle in the sub-volume T (i.e. in the slice running transverse to the longitudinal axis of the patient body). Therefore stronger radio-frequency pulses are used in the subsequent magnetic resonance measurement in order to correspondingly increase the flip angle.

Figure 3:
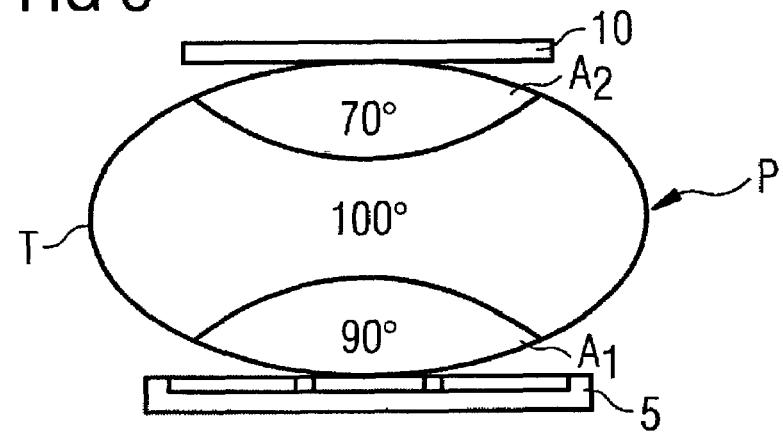
FIG. 3 is a presentation as in FIG. 2, but after increase of the amplitude of the emitted radio-frequency pulses.

This situation is shown in FIG. 3. As can be seen therein, the increase of the emitted $B_1$ field strength leads to the situation that an average flip angle of 90° is now actually achieved in the region of interest $A_1$ at the spinal column. An average flip angle of 70° is still generated in the abdomen region $A_2$ below the auxiliary coil element 10 and an average flip angle of 100° is generated in the remaining region of the sub-volume T.

However, the flip angle in the spinal column region $A_1$ that is optimally adjusted here is of primary relevance in this measurement. It is not necessary to place the manipulating element on the region $A_1$ to be manipulated, which is different than in previous manipulation methods with dielectric cushions. The distance between the spinal column local coil 5 and the body of the patient P thus does not have to be increased, such that a better signal can be acquired from the spinal column local coil 5. Instead of this distance increase, the auxiliary coil element 10 must simply only be placed on the abdomen of the patient P, which is freely accessible.

Figure 4:
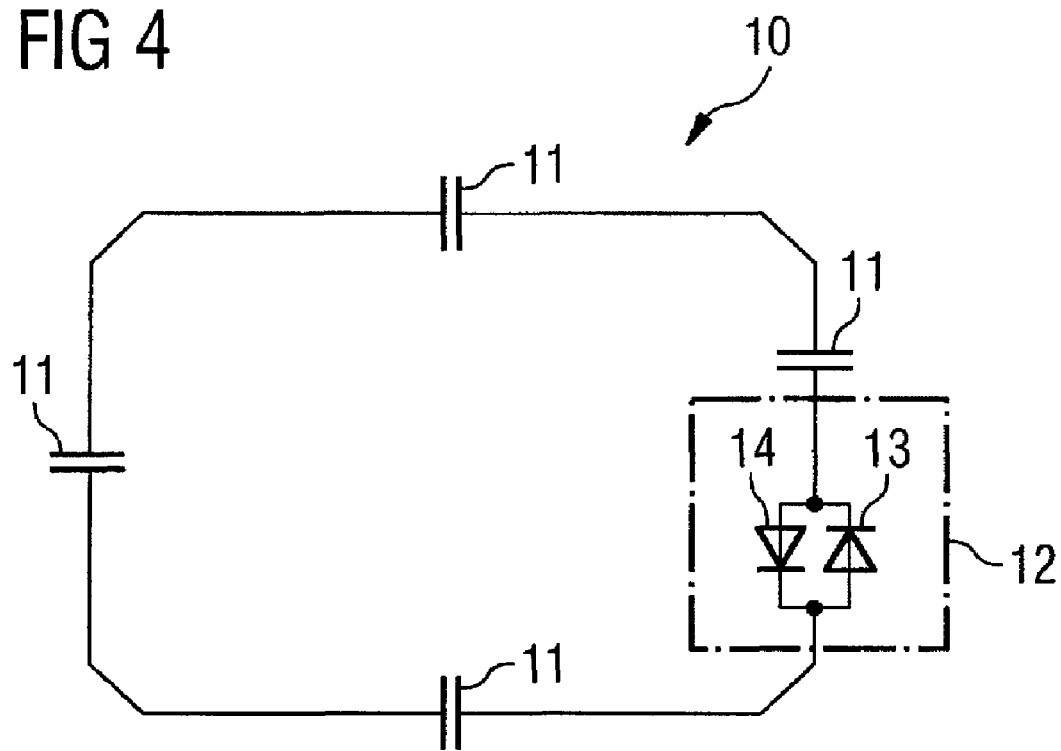
FIG. 4 is a simple circuit diagram for a first exemplary embodiment of an inventive auxiliary coil element for an application as in FIGS. 2 and 3.

FIG. 4 shows an exemplary embodiment for the design of such an auxiliary coil element 10.

This auxiliary coil element 10 essentially includes an oscillating circuit which is designed from a simple annular conductor that is interrupted on four sides by capacitors 11. The basis shape of the conductor ring is arbitrary and can, for example, be circular or rectangular (as here). By suitable selection of the capacitance values of the capacitors 11 and the dimensions of the coil, the eigenresonance frequency of the auxiliary coil element 10 can be adjusted such that this exhibits the value required for the desired effect. As explained above, the coil should destructively resonate to attenuate the $B_1$ field, meaning that the coil should exhibit an eigenresonance frequency that lies somewhat below the magnetic resonance frequency. A coil according to FIG. 4 with the dimensions b=30 cm and a=25 cm as well as with capacitors 11 on the order of approximately 33 pF has achieved an eigenresonance frequency of approximately 108 MHz, for example. This auxiliary coil element 10 is suitable in order to shield the $B_1$ field relatively well in the axial region and in the center of the auxiliary coil element 10 at this magnetic resonance frequency of 123 MHz.

In principle, one or more of the capacitors 11 can also be fashioned such that they can be detuned in order to be able to adjust the eigenresonance frequency of the auxiliary coil element. Like conventional acquisition coils, the auxiliary coil element 10 can be fashioned both rigid and flexible, for example in that the annular conductor length is imprinted as copper strips on a flexible film.

The preferred exemplary embodiment of an auxiliary coil element 10 shown in FIG. 4 comprises a circuit arrangement 12 which provides that the entire auxiliary coil element 10 is active only in the transmission phases of the magnetic resonance system and is inactive in the acquisition phases. For this the circuit arrangement 12 has two radio-frequency rectifier diodes 13, 14 connected in antiparallel. These only conduct above a first applied voltage, i.e. above a specific limit field strength of the transmission field. Depending on the selection of the diodes the through-connect voltage lies between 0.3 and 0.7 volts. For example, it lies at approximately 0.3 volts for Schottky diodes.

It is thus automatically provided that these diodes 13, 14 conduct only when a relatively strong radio-frequency field is emitted within the transmission phases and thus the oscillating circuit is closed and the auxiliary coil element 10 is active. By contrast, these diodes 13, 14 are not conductive in the acquisition phases in which no radio-frequency signal is emitted (but rather in which the induced magnetic resonance signal should be acquired) since the induced magnetic resonance signal is much too weak. Since the auxiliary coil element 10 is not active in the acquisition case, it can consequently not attenuate the magnetic resonance signals. Given the auxiliary coil element 10 according to FIG. 4 it is thus automatically achieved by design that the auxiliary coil element 10 is only active in the transmission case.

Figure 5:
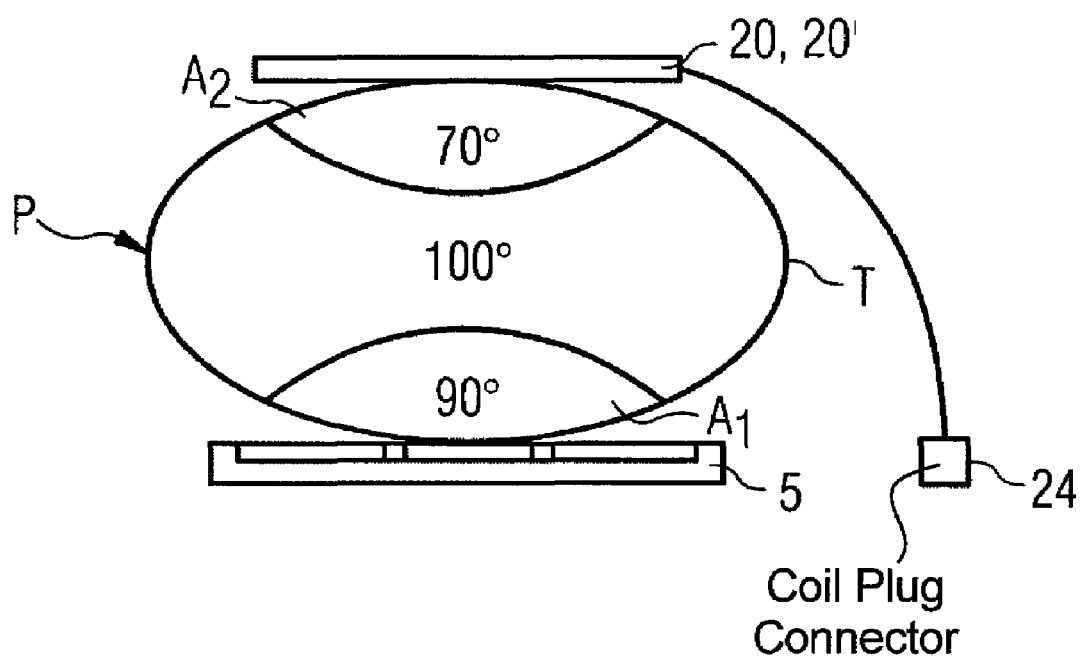
FIG. 5 is a presentation as in FIG. 3, but with an auxiliary coil element which can be activated an deactivated via an external connection.

FIG. 5 shows a further variant with an auxiliary coil element 20, 20' which can be activated by the magnetic resonance system or a control device of the magnetic resonance system via a coil plug connector 24 in order to activate or to deactivate the appertaining auxiliary coil element 20, 20'.

Figure 6:
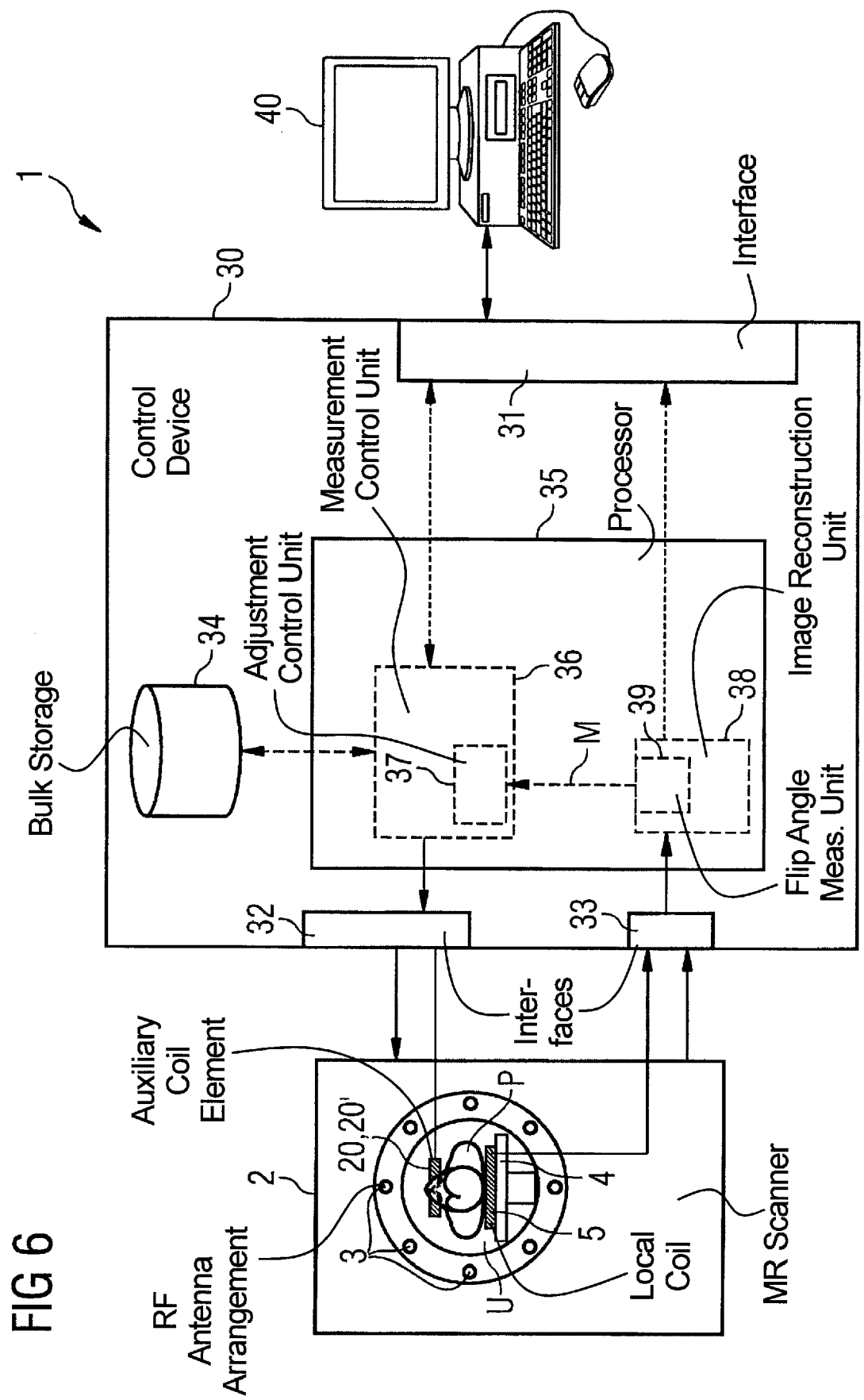
FIG. 6 is a schematic block diagram for an exemplary embodiment of an inventive magnetic resonance system with an auxiliary coil element as in FIG. 5.

A simple principle block diagram of a corresponding magnetic resonance system 1 is shown in FIG. 6. The core of the magnetic resonance system 1 is an MR tomographic data acquisition unit (also called an MR scanner 2) in which a patient P is positioned on a bed 4 in an annular examination volume U. A radio-frequency antenna arrangement 3 (for example a birdcage antenna) for emission of the magnetic resonance radio-frequency pulses (i.e. for emission of the $B_1$ field) is located within the scanner 2. It can be a commercially available scanner 2.

The scanner 2 is controlled by a control device 30. A terminal 40 (or, respectively, an operator console) is connected to the control device 30 via a terminal interface 31 via which an operator can operate the control device 30 and therewith the scanner 2. The control device 30 is connected with the scanner 2 via a scanner control interface 32 and an image acquisition interface 33. The corresponding control commands are output to the scanner 2 via the scanner control interface 32 so that the desired pulse sequences are emitted, i.e. the radio-frequency pulses and the gradient pulses for the gradient coils (not shown) for generation of the desired magnetic fields. The raw data (i.e. the acquired magnetic resonance signals) are read out via the image data acquisition interface 33.

Both the control device 30 and the terminal 40 can also be integral components of the scanner 2.

The control device 30 moreover has a bulk storage 34 in which, for example, generated image data can be stored and measurement protocols can be saved.

The entire magnetic resonance system 1 moreover also exhibits all further typical components or, respectively, features such as, for example, interfaces for connection to a communication network that is connected with an image information system (PACS—Picture Archiving and Communication System) or offers connection possibilities for external data stores. However, these components are not all shown in FIG. 6 for better clarity.

A central point in the control device 30 is a processor 35 in which various control components are realized in the form of software. It is noted that such a control device 30 can naturally also include a number of processors networked with one another on which the various control components are realized, for example in the form of program modules.

Such a component is the measurement/control unit 30 with which the user can communicate via the terminal 40. This measurement/control unit 30 controls the scanner 2 via the control interface 32 and thus provides—based on the parameter values stored in the measurement protocols and possibly modified or predetermined by the operator—for the emission of the desired parameter values via the radio-frequency antenna arrangement 3 and furthermore that the gradients are switched in a suitable manner in order to implement the desired measurements.

The measurement data arriving via the image acquisition interface 33 are relayed to a further component realized on the processor 35, an image reconstruction unit 38 which correspondingly processes the acquired raw data. The image reconstruction unit 38 implements a Fourier transformation of the raw data and thus provides a reconstruction of images. The images can then be prepared further and displayed to the operator (for example via the terminal 40) or also be stored in the bulk storage 34.

The magnetic resonance system 1 here comprises an adjustment control unit 37 as a further component within the control device 30—likewise in the form of software on the processor 35. This is shown as a sub-module of the measurement/control unit 36. This adjustment control unit 37 provides that suitable radio-frequency pulse sequences are emitted in the framework of an adjustment measurement in order to excite specific sub-volumes T in the form of slices in the body of the patient P. These raw data thereby generated are acquired, for example, via the antenna arrangement 3 and read out via the image acquisition interface 33. The average flip angle within the respective sub-volumes T can then be determined within a flip angle measurement unit 39 of the image reconstruction unit 38 and, for example, also be converted into an average $B_1$ field. This value is then made available for the subsequent magnetic resonance measurement as a $B_1$ measurement value M of the measurement/control unit 30 for the determination of the transmission parameters (such as, for example, the radio-frequency field strength to be emitted).

In the exemplary embodiment shown in FIG. 6 the $B_1$ field in the abdomen region $A_2$ of the patient is reduced with the aid of an auxiliary coil element 20, 20' to locally increase the $B_1$ field in the spinal column region $A_1$ (as this is shown in FIG. 5). The auxiliary coil element 20, 20' is thereby activated or deactivated with the aid of a suitable signal which is output by the control interface 32. An activation respectively ensues during the transmission phases and a deactivation during the acquisition phases. Given this design it can also additionally be provided that the auxiliary coil element 20, 20' is activated only during the adjustment measurement, but not during the subsequent magnetic resonance measurement. However, it is noted that the magnetic resonance system can just as well be equipped with an auxiliary coil element 10 that deactivates itself in the acquisition phases and activates itself in the transmission phases instead of an auxiliary coil element 20, 20' that can be activated via the control device 30. The functionality of this auxiliary coil element was already explained using FIGS. 1 through 4.

Figure 7:
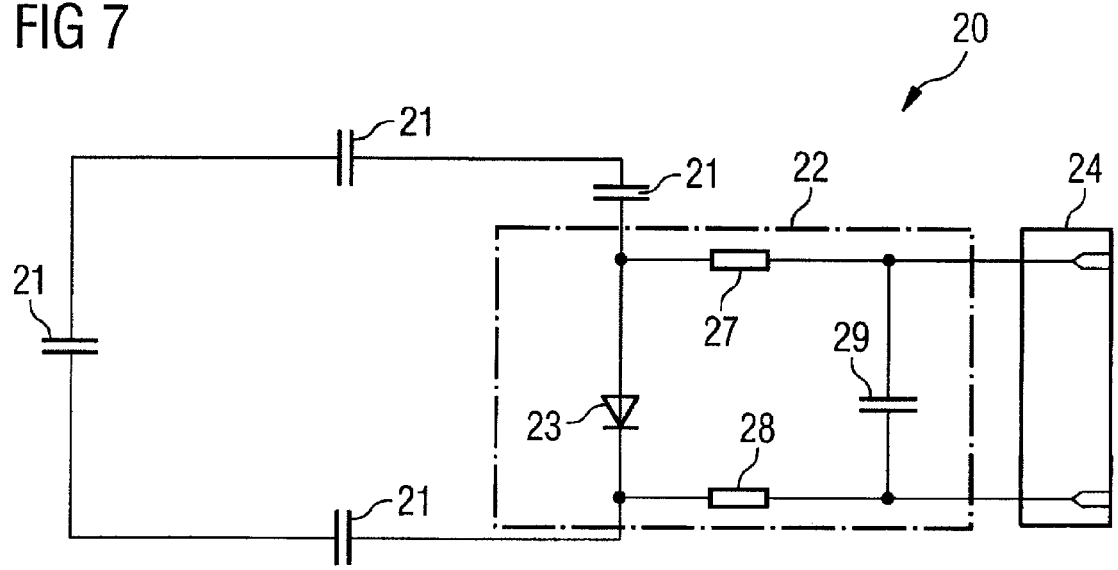
FIG. 7 is a circuit diagram for an auxiliary coil element for application in a design according to FIG. 5 according to a first exemplary embodiment.

FIG. 7 shows a circuit diagram for a preferred variant of an auxiliary coil element 20 that can be activated and deactivated in a targeted manner via a control device 30. The auxiliary coil element 20 can in principle be designed just like the auxiliary coil element 10 according to FIG. 4, i.e. as an annular conductor trace with a number of capacitor elements 21. The dimensions of the annular conductor and the values of the capacitors 21 can likewise be identical. Only the circuit arrangement 22 for activation and deactivation is fashioned differently than in the auxiliary coil element 10 according to FIG. 4. In the exemplary embodiment according to FIG. 7 this circuit arrangement 22 comprises a single PIN diode 23 which is specifically wired into a coil plug 24 via connectors. If a barrier voltage of approximately 200 V is applied in the barrier direction of the PIN diode 23 at the connections, the PIN diode 23 is completely blocked and the auxiliary coil element 20 is thus deactivated. This can also ensue in the transmission case. By contrast, if a direct current of approximately 100 mA is conducted to the PIN diode in the matching direction via the connectors in the coil plug 24 the PIN diode 23 becomes conductive and the auxiliary coil element 20 is activated. This ensues only in the transmission case. The additional coils 27, 28 are choke coils and can possess a measure of approximately 10 µH. A capacitor 29 on the order of 1 nF is arranged parallel to the PIN diode 23 to be connected. The chokes 27, 28 and the capacitor 29 serve as a radio-frequency block so that the radio-frequency signals do not arrive at the control device 30 via the coil plug 24.

Figure 8:
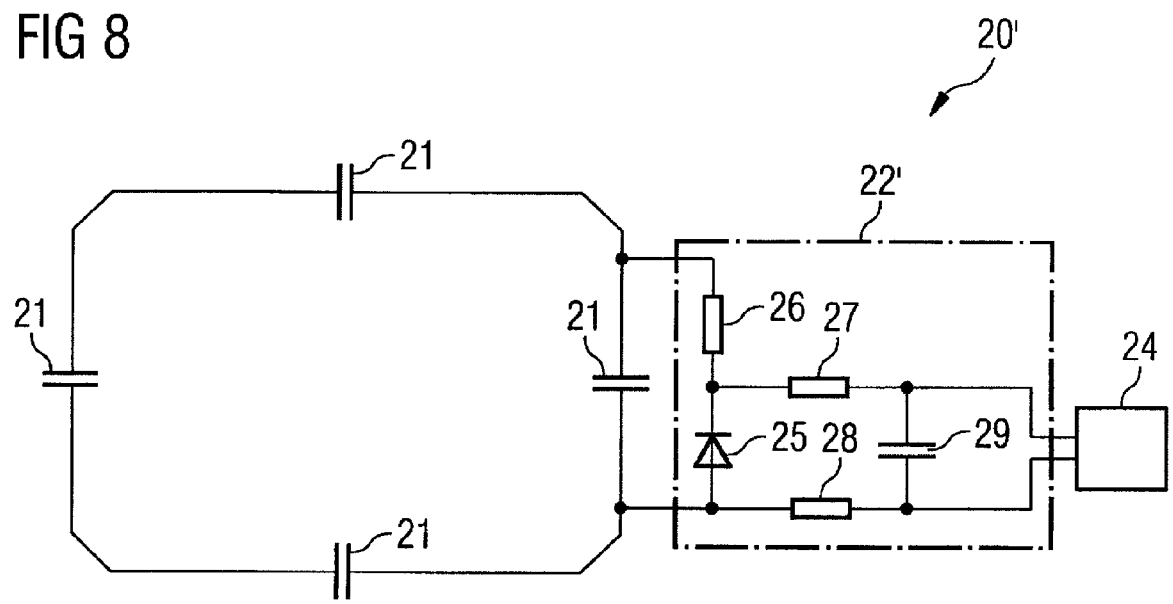
FIG. 8 is a circuit diagram for an auxiliary coil element for application in a design according to FIG. 5 according to a second exemplary embodiment.

FIG. 8 shows a further variant for an auxiliary coil element 20' that can be connected via the control device 30. Here the circuit arrangement 22' is arranged parallel to one of the capacitors 21 in an oscillating circuit of the auxiliary coil element 20'. A diode 25 and a coil 26 on the order of 10 nF are connected in series parallel to the capacitor 21. The measure of the capacitors here again lies at approximately 33 pF, as in the exemplary embodiment according to FIG. 7; the dimensions likewise correspond to those of the auxiliary coil element according to FIG. 4 in order to again achieve an eigenresonance frequency of 108 MHz.

Here as well the diode 25 (which can likewise be a PIN diode 25) is connected at a plug connector 24 via two chokes 27, 28 and a further capacitor 29 which is parallel to the diode 25. If the diode 25 is conductive in this case, due to the coil 26 and the capacitor 21 connected in parallel an oscillating circuit parallel to the actual oscillating circuit of the auxiliary coil element 20' thus arises which provides that the eigenresonance of the auxiliary coil element 20' is very narrowband and strongly detuned.

This means that upon through-connection of the diode 25 the auxiliary coil element is deactivated to a very significant extent via detuning of the eigenresonance frequency.

For comparison, FIG. 9 shows two magnetic resonance images of a phantom in which it can be recognized how the inventive method works. The right image thereby shows a cross-section through a cylindrical phantom flattened on two sides. Thereby shown is the achieved flip angle upon radiation of an innately homogeneous $B_1$ field by the whole-body coil without the phantom. The radio-frequency voltage was thereby 259 V and the emitted radio-frequency power was 1,210 watts. As shown here, the actual $B_1$ field is significantly decreased in the lower region $A_1$ and in the upper region $A_2$. Here a strongly reduced flip angle of only approximately 45° is therefore measured, wherein a flip angle of approximately 90° is achieved in the middle region.

The adjustment after use of an auxiliary coil element 10 during the adjustment measurement appears in the left image. Here the flip angle in the upper region $A_2$ is in fact directly reduced at the auxiliary coil element 10 due to the attenuating effect of the auxiliary coil element 10. Moreover, the flip angle can be significantly increased in the lower region $A_1$ in order to be able to implement a measure in this region.

This example shows that the $B_1$ field can also be locally manipulated with very simple means at locations at which no correction element (such as, for example, a dielectric cushion) can be arranged. An intervention in the magnetic resonance system or, respectively, in the control of the magnetic resonance system is thereby not absolutely necessary when, as shown in FIG. 9, an auxiliary coil element 10 is used which independently deactivates in the acquisition phases and only activates in the transmission phases.

In conclusion it is noted again that the method as well as the presented systems and auxiliary coil elements that are described in detail in the preceding are merely exemplary embodiments which can be modified in the most varied manner by the average man skilled in the art without leaving the scope of the invention. The invention is thus not limited to the exemplary embodiment that the $B_1$ field is too low in the spinal column region and should be increased with the aid of the inventive method; rather, the $B_1$ field can be manipulated in the same manner in any arbitrary region within the body of the patient, wherein the $B_1$ field can not only be increased but can also be decreased in an analogous manner, for example.

The invention also encompasses the use of a number of auxiliary coil elements simultaneously, instead of only one auxiliary coil element, insofar as this is desired. For example, it is advantageous when a complete acquisition should be produced along the entire spinal column. In this case a number of auxiliary coil elements can be placed next to one another on the body of the patient in the longitudinal direction of the patient.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for locally manipulating a $B_1$ field in a first region of an examination subject in an examination volume of a magnetic resonance system, said method comprising the steps of:

in an adjustment measurement, measuring a $B_1$ measurement value in sub-volume of the examination subject that is representative of the $B_1$ field in the sub-volume, and integrating said $B_1$ measurement value over said sub-volume;

from the $B_1$ measurement value integrated over said sub-volume, automatically determining radio-frequency signal parameters for a subsequent diagnostic magnetic resonance measurement of the examination subject to manipulate said $B_1$ field in said first volume during said diagnostic magnetic resonance measurement; and while measuring said $B_1$ measurement value in said adjustment measurement, influencing the $B_1$ field in a second region in the examination subject counter to the manipulation in said first region by activating an auxiliary coil element located in said second region or at said second region.

2. A method as claimed in claim 1 comprising operating said auxiliary coil element to destructively resonate to reduce the $B_1$ field in the second region to increase the $B_1$ field in the first region.

3. A method as claimed in claim 1 comprising operating said auxiliary coil element to constructively resonate to increase the $B_1$ field in the second region and to reduce the $B_1$ field in the first region.

4. A method as claimed in claim 1 comprising activating the auxiliary coil element only during transmission phases of the magnetic resonance system and deactivating said auxiliary coil element during acquisition phases.

5. A method as claimed in claim 4 wherein said auxiliary coil element self-activates during said transmission phases and self-deactivates in said acquisition phases.

6. A method as claimed in claim 1 comprising externally controlling operation of said auxiliary coil element to activate the auxiliary coil element during said transmission phases and to deactivate the auxiliary coil element during said acquisition phases.

7. A method as claimed in claim 6 comprising activating said auxiliary coil element only during said adjustment measurement.

8. A method as claimed in claim 1 comprising manipulating said $B_1$ field in the first region to homogenize the $B_1$ field within the sub-volume.

9. A method as claimed in claim 1 comprising arranging a local coil of the magnetic resonance system adjacent to the first region of the examination subject, and arranging said auxiliary coil element at the second region relative to the examination subject opposite to the local coil.

10. A magnetic resonance system for locally manipulating a $B_1$ field in a first region of an examination subject in an examination volume of a magnetic resonance system, comprising:

a magnetic resonance scanner operable to conduct a magnetic resonance measurement of an examination subject including generation of a $B_1$ field; and a control unit that operates said magnetic resonance scanner to measure, in an adjustment measurement, a $B_1$ measurement value in sub-volume of the examination subject that is representative of the $B_1$ field in the sub-volume, and that integrates said $B_1$ measurement value over said sub-volume, and that, from the $B_1$ measurement value integrated over said sub-volume, automatically determines radio-frequency signal parameters for a subsequent diagnostic magnetic resonance measurement of the examination subject to manipulate said $B_1$ field in said first volume during said diagnostic magnetic resonance measurement; and an auxiliary coil element that is activated while measuring said $B_1$ measurement value in said adjustment measurement to influence the $B_1$ field in a second region in the examination subject counter to the manipulation in said first region.

11. A magnetic resonance system as claimed in claim 10 wherein said auxiliary coil element destructive resonates to reduce the $B_1$ field in the second region to increase the $B_1$ field in the first region.

12. A magnetic resonance system as claimed in claim 10 wherein said auxiliary coil element constructively resonates to increase the $B_1$ field in the second region and to reduce the $B_1$ field in the first region.

13. A magnetic resonance system as claimed in claim 10 wherein the auxiliary coil element is activated only during transmission phases of the magnetic resonance system and is deactivated during acquisition phases.

14. A magnetic resonance system as claimed in claim 13 a circuit connected to said auxiliary coil element that self-activates said auxiliary coil element during said transmission phases and self-deactivates said auxiliary coil element in said acquisition phases.

15. A magnetic resonance system as claimed in claim 14 wherein said circuit is an oscillating circuit of the auxiliary coil element with a plurality of switch elements therein that automatically place the oscillating circuit in a non-conducting state when a limit value, that is associated with the switch elements and that is dependent on the $B_1$ field, is not exceeded and that automatically place the oscillating circuit in a conducting state when said limit value is exceeded.

16. A magnetic resonance system as claimed in claim 15 wherein said switch elements comprise rectifier diodes connected with opposite polarity in said oscillating circuit.

17. A magnetic resonance system as claimed in claim 10 wherein said control unit controls operation of said auxiliary coil element to activate the auxiliary coil element during said transmission phases and to deactivate the auxiliary coil element during said acquisition phases.

18. A magnetic resonance system as claimed in claim 17 wherein said control unit activates said auxiliary coil element only during said adjustment measurement.

* * * * *